(12) United States Patent
Sakamoto

(10) Patent No.: US 6,320,136 B1
(45) Date of Patent: Nov. 20, 2001

(54) LAYERED PRINTED-CIRCUIT-BOARD AND MODULE USING THE SAME

(75) Inventor: Akira Sakamoto, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/354,563

(22) Filed: Jul. 16, 1999

(30) Foreign Application Priority Data

Jan. 25, 1999 (JP) ............................................. H11-015043

(51) Int. Cl.[7] ................................. H05K 1/03; H05K 1/16
(52) U.S. Cl. ........................... 174/255; 174/258; 174/260; 174/256; 361/751; 361/760; 257/713; 257/669
(58) Field of Search ...................................... 174/255, 250, 174/258, 256, 259, 267, 261, 260; 361/760, 717, 705, 708, 751, 779, 749, 750; 257/734, 666, 713, 692, 669, 676, 784, 783; 438/118, 123, 106, 612; 29/830, 827, 832

(56) References Cited

U.S. PATENT DOCUMENTS

| | | | | |
|---|---|---|---|---|
| H921 | * | 5/1991 | Wannemacher, Jr. ................. | 361/767 |
| 4,654,248 | * | 3/1987 | Mohammed .......................... | 428/137 |
| 4,658,332 | * | 4/1987 | Baker et al. .......................... | 361/751 |
| 4,740,414 | * | 4/1988 | Shaheen ................................ | 428/210 |
| 4,876,120 | * | 10/1989 | Belke et al. .......................... | 428/1.54 |
| 5,072,074 | * | 12/1991 | DeMaso et al. ...................... | 174/254 |
| 5,142,441 | * | 8/1992 | Seibold et al. ........................ | 361/689 |
| 5,248,853 | * | 9/1993 | Ishikawa et al. ..................... | 174/256 |
| 5,473,119 | * | 12/1995 | Rosenmayer et al. ............... | 174/255 |
| 5,834,848 | * | 9/1998 | Iwasaki ................................. | 257/778 |
| 6,050,832 | * | 4/2000 | Lee et al. ............................... | 439/91 |
| 6,177,728 | * | 1/2001 | Susko et al. .......................... | 257/737 |
| 6,183,592 | * | 2/2001 | Sylvester .............................. | 156/299 |

FOREIGN PATENT DOCUMENTS

| | | | |
|---|---|---|---|
| 402278788 | * | 9/1990 | (JP) . |
| 404284687 | * | 10/1992 | (JP) . |
| 405003387 | * | 1/1993 | (JP) . |

* cited by examiner

Primary Examiner—Jeffrey Gaffin
Assistant Examiner—I B Patel
(74) Attorney, Agent, or Firm—Wenderoth, Lind & Ponack, L.L.P.

(57) ABSTRACT

A printed circuit board, on which an electronic component with leads is mounted, includes a first conductive layer; an insulating layer formed on the first conductive layer; a second conductive layer formed on the insulating layer; and a buffer region. The second conductive layer is provided with pads to be connected to the leads of the electronic component. The buffer region has a thermal expansion coefficient lower than the first conductive layer and is arranged between the first conductive layer and the insulating layer to ease thermal expansion of the first conductive layer.

28 Claims, 9 Drawing Sheets

LAYERED PRINTED-CIRCUIT-BOARD AND MODULE USING THE SAME

CROSS REFERENCE TO RELATED APPLICATION

This application claims the priority of Application No. H11-15043, filed Jan. 25, 1999 in Japan, the subject matter of which is incorporated herein by reference.

TECHNICAL FIELD OF THE INVENTION

The present invention relates to a layered printed-circuitboard, which is provided with a characteristic of high resistance to heat variation.

BACKGROUND OF THE INVENTION

In general, a printed circuit board is a flat board whose front contains slots for integrated circuit chips and connections for a variety of electronic components, and whose back is printed with electrically conductive pathways between the components.

A semiconductor apparatus is fabricated by mounting semiconductor integrated circuits onto a printed circuit board. Such a semiconductor apparatus hereinafter is called a "module". In recent years, multi-layered structural type modules have been used to improve integration rate and high-frequency characteristics.

A conventional semiconductor apparatus (module) includes a semiconductor chip; leads connected at one end to the semiconductor chip; metal wires connected between the semiconductor chip and the leads; and a seal material (package). The seal material (package) may be made of epoxy resin or silicon resin to protect the semiconductor chip.

The module also includes a layered printed-circuit-board and pads, formed on the layered printed-circuit-board. The pads are electrically connected to the leads through conductive material paste (conductive adhesive), such as solder or silver paste.

Usually, the package has a thermal expansion coefficient of around $7 \times 10^{-6}/°$ C., while the layered printed-circuit-board has a thermal expansion coefficient of around $15 \times 10^{-6}/°C$. It means that there is a lot of difference in thermal expansion coefficient between the package and the layered printed-circuit-board.

In fabrication process of a module (semiconductor device module), a temperature cycling test is carried out. According to such a temperature cycling test, the temperature atmosphere of the module is changed with a predetermined cycle. According to the conventional module, in the temperature cycling test, mechanical stress is concentrated at the conductive material paste, because of the difference of thermal expansion coefficient between the package and the layered printed-circuit-board. As a result, a crack may be made in the conductive material paste. Such a crack results in a disconnection, and therefore the module becomes inoperative.

For solving the above problems in a temperature cycling test, a printed circuit board having a low thermal-expansion-coefficient can be used. If such a printed circuit board is used, the costs for the module is increased.

OBJECTS OF THE INVENTION

Accordingly, an object of the present invention is to provide a layered printed-circuit-board having a high resistance to heat variation.

Another object of the present invention is to provide a semiconductor circuit module including a layered printed-circuit-board having a high resistance to heat variation.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a printed circuit board, on which an electronic component with leads is mounted, includes a first conductive layer; an insulating layer formed on the first conductive layer; a second conductive layer formed on the insulating layer; and a buffer region. The second conductive layer is provided with pads to be connected to the leads of the electronic component. The buffer region has a thermal expansion coefficient lower than the first conductive layer and is arranged between the first conductive layer and the insulating layer to ease thermal expansion of the first conductive layer.

According to a second aspect of the present invention, a semiconductor circuit module includes a semiconductor package which contains a semiconductor chip therein and is provided with leads; and the layered printed-circuit-board described above. The semiconductor package is mounted on the layered printed-circuit-board, so that the leads of the semiconductor package are electrically connected thereto.

In the present invention, the first conductive layer may be made of copper. The buffer region may be located at an area corresponding to the pads of the second conductive layer. The buffer region may be a blank region, in which no conductive pattern is formed. The buffer region may be filled with a buffer material, such as silicon rubber.

The buffer region may be a buffer layer formed throughout on the first conductive layer. The buffer layer may be made of silicon rubber.

DETAILED DISCLOSURE OF THE INVENTION

For better understanding of the present invention, a conventional technology is first described.

Figure 1A:
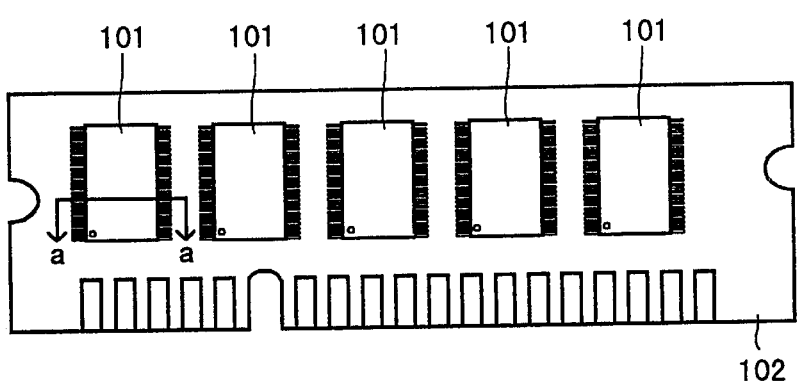
FIG. 1A is a plan view illustrating a conventional semiconductor apparatus (module).
Figure 1C:
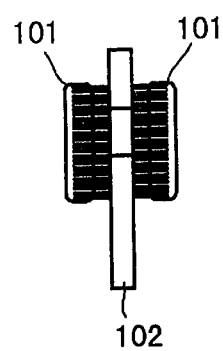
FIG. 1C is a front view illustrating the conventional semiconductor apparatus (module), shown in FIG. 1A.
Figure 1B:
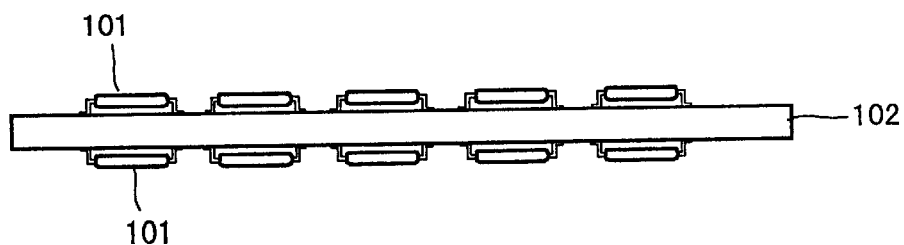
FIG. 1B is a side view illustrating the conventional semiconductor apparatus (module), shown in FIG. 1A.

FIGS. 1A to 1C show a conventional semiconductor apparatus (module), which includes a semiconductor package 101 and a layered printed-circuit-board 102. Hereinafter, the semiconductor package 101 is called just "package". The layered printed-circuit-board 102 includes a substrate (board base); an electric circuit formed on the substrate; and terminals. The substrate is made of ceramics, glass epoxy resin, and the like. The electric circuit is made by forming conductive wiring patterns on the substrate. The package 101 contains a semiconductor chip, not shown. Electric signals are transferred through the terminals between the semiconductor chip and external devices.

Although the package 101 is a T-SOP type (Thin Small Outline Package) in FIG. 1, other types of packages can be employed, such as BGA (Ball Grid Array) and TCP (Tape Carrier Package).

Figure 2:
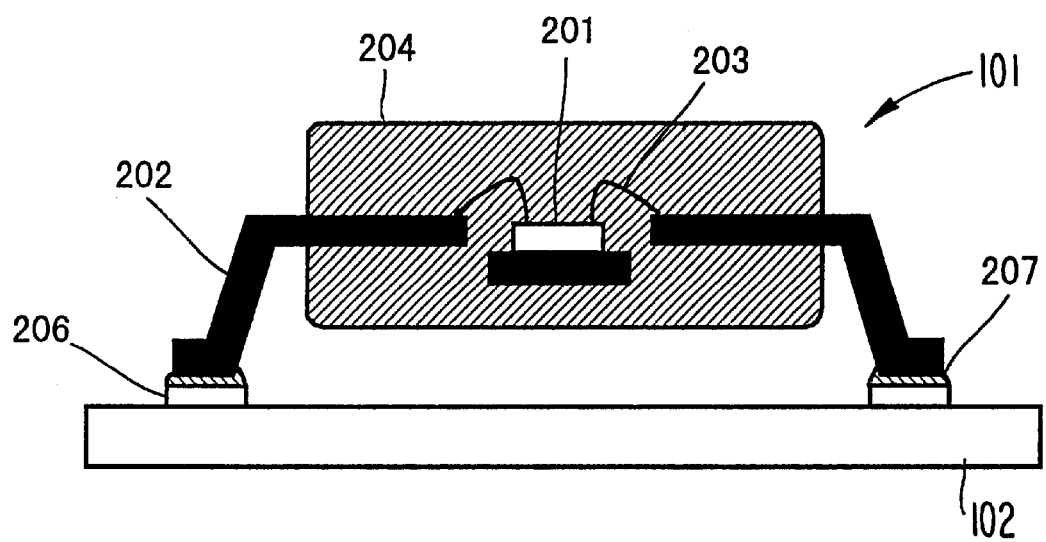
FIG. 2 is an enlarged cross-sectional view taken on line a—a in FIG. 1A.

FIG. 2 is an enlarged cross-sectional view taken on line a—a in FIG. 1. The module includes a package 101 formed of a semiconductor chip 201; leads 202 each connected at one end to the semiconductor chip 201; metal wires 203 connected between the semiconductor chip 201 and the leads 202; and a seal material 204. The leads 202 may be made of copper or alloy to transmit electric signals between the semiconductor chip 201 and external devices. The metal wires 203 may be made of gold or aluminum to transmit electric signals between the semiconductor chip 201 and the leads 202. The seal material 204 may be made of epoxy resin or silicon resin to protect the semiconductor chip 201.

The module also includes a layered printed-circuit-board 102, shown in FIGS. 1A to 1C, and pads 206 formed on the layered printed-circuit-board 205. The pads 206 are electrically connected to the leads 202 through conductive material paste (conductive adhesive) 207, such as solder or silver paste. In general, the layered printed-circuit-board 102 employs four to eight layered structure.

Figure 3:
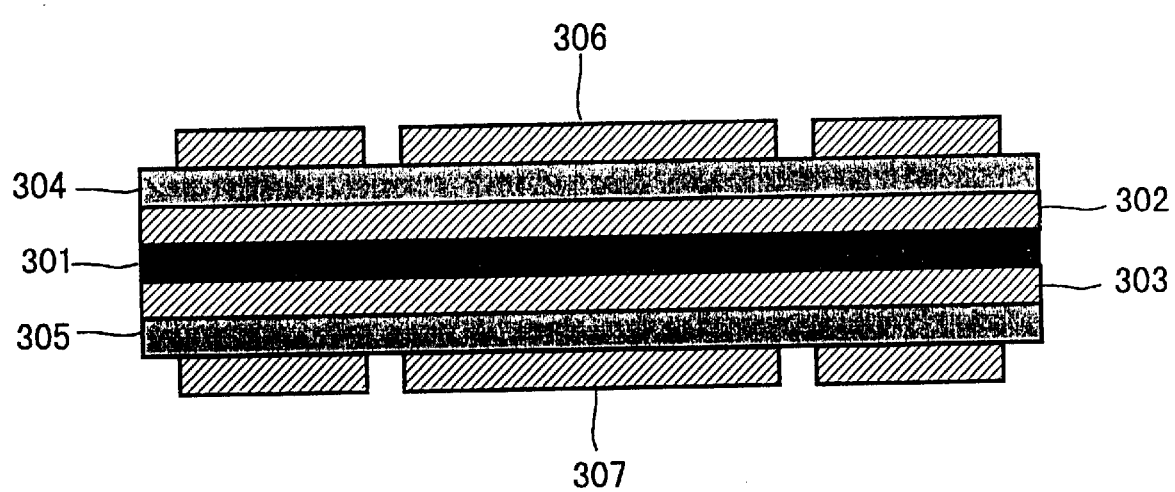
FIG. 3 is a cross-sectional view illustrating a conventional type of layered printed-circuit-board.

FIG. 3 is a cross-sectional view showing a conventional four-layered printed-circuit-board. The printed circuit board includes a core layer 301; and intermediate conductive patterns 302 and 303, which are formed on both surfaces of the core layer 301. The core layer 301 is, for example, made of glass epoxy resin. The intermediate conductive patterns 302 and 303 are, for example, made of copper, and are formed throughout on the surfaces of the core layer 301.

The printed circuit board further includes insulating adhesive layers 304 and 305, respectively formed on the intermediate conductive patterns 302 and 303; and surface conductive patterns 306 and 307 formed on the insulating adhesive layers 304 and 305, respectively. The insulating adhesive layers 304 and 305 are generally made of epoxy resin. The surface conductive patterns 306 and 307 are, for example, made of copper. The surface conductive patterns 306 and 307 mainly function to connect devices mounted on the printed circuit board to each other and to form an electric circuit pattern. In general, the intermediate conductive patterns 302 and 303 are connected to the ground or a power supply.

Usually, the package 101 (T-SOP) has a thermal expansion coefficient of around $7 \times 10^{-6}/°$ C., while the layered printed-circuit-board 102 has a thermal expansion coefficient of around $15 \times 10^{-6}/°$ C. It means that there is a lot of difference in thermal expansion coefficient between the package 101 and the layered printed-circuit-board 102.

Figure 4:
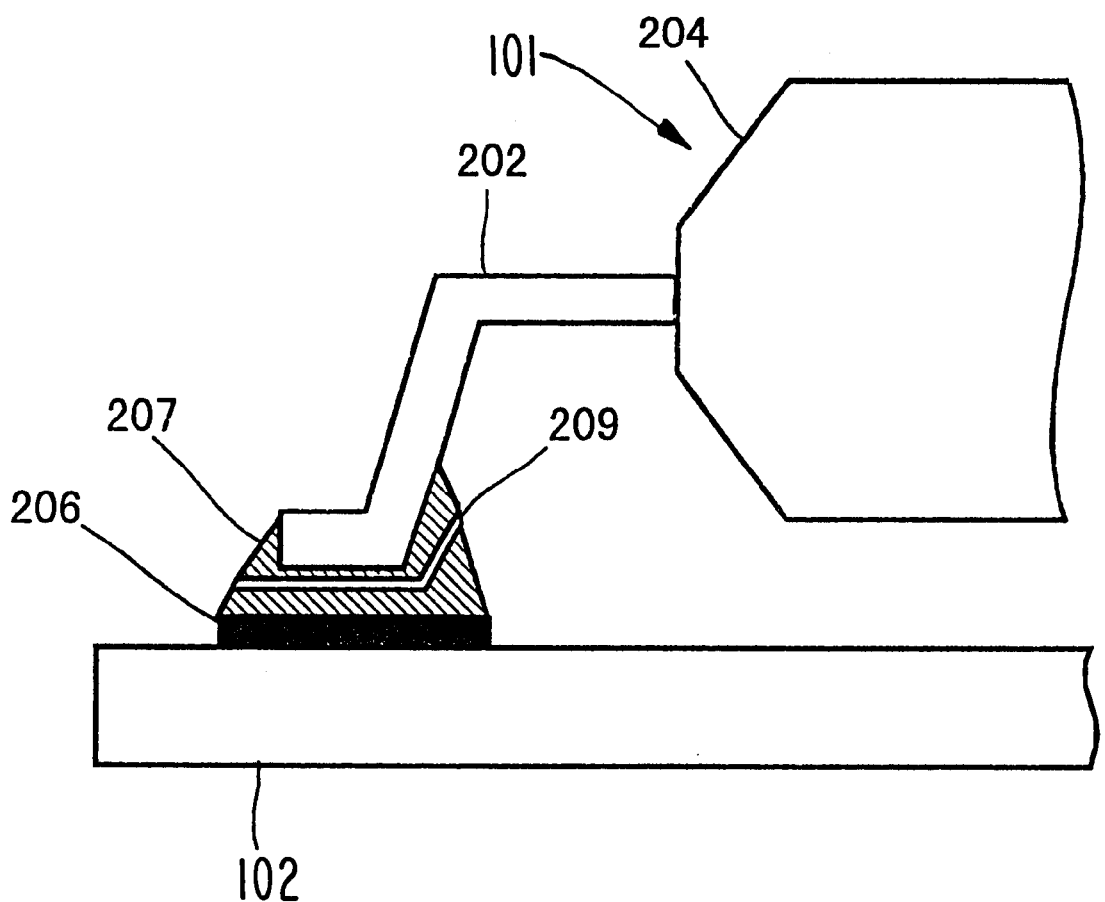
FIG. 4 is a front view (partly cross-sectional) showing a conventional semiconductor apparatus (module).

In fabrication process of a module (semiconductor device module), a temperature cycling test is carried out. According to such a temperature cycling test, the temperature atmosphere of the module is changed with a predetermined cycle. According to the conventional module, in the temperature cycling test, mechanical stress is concentrated at the conductive material paste 207 (shown in FIGS. 2 and 4), because of the difference in the thermal expansion coefficient between the package 101 and the layered printed-circuit-board 102. As a result, a crack may be made in the conductive material paste 207. Such a crack results in a disconnection 209, as shown in FIG. 4, and therefore the module becomes inoperative.

For solving the above problems in a temperature cycling test, a printed circuit board having a low thermal-expansion-coefficient can be used. If such a printed circuit board is used, the costs for the module is increased.

Figure 5:
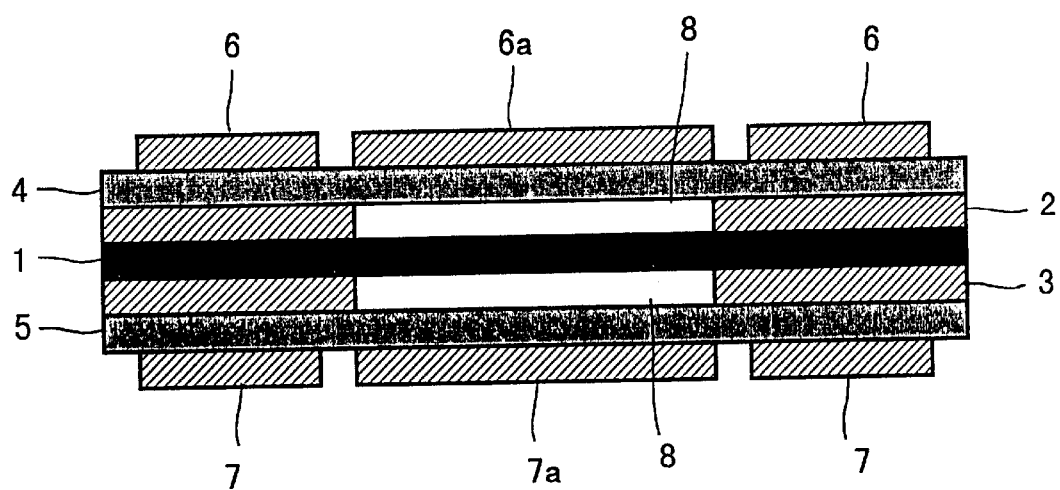
FIG. 5 is a cross-sectional view illustrating a layered printed-circuit-board according to a first preferred embodiment of the present invention.

FIG. 5 is a cross-sectional view showing a layered printed-circuit-board according to a first preferred embodiment of the present invention. The printed circuit board is fabricated to be a four-layered structure, in which four conductive layers are included. The printed circuit board includes a core layer 1; and intermediate (first) conductive layers 2 and 3, which are formed on both surfaces of the core layer 1. The core layer 1 is, for example, made of glass epoxy resin. The intermediate (first) conductive layers 2 and 3 are, for example, made of copper, and are formed throughout on the surfaces of the core layer 1.

The printed circuit board further includes insulating adhesive layers 4 and 5, respectively formed on the intermediate (first) conductive layers 2 and 3; and surface (second) conductive layers 6 and 7 formed on the insulating adhesive layers 4 and 5, respectively. The insulating adhesive layers 4 and 5 are generally made of epoxy resin. The surface (second) conductive layers 6 and 7 are, for example, made of copper. The printed circuit board still further includes pads 6a and 7a within the surface (second) conductive layers 6 and 7.

The surface conductive layers 6 and 7 mainly function to connect devices mounted on the printed circuit board to each other and to form an electric circuit pattern. In general, the intermediate conductive layers 2 and 3 are connected to the ground or a power supply. The pads 6a and 7a electrically connect electrodes (leads) of a semiconductor chip, to be mounted on the printed circuit board, to the surface conductive layers 6 and 7.

Figure 6A:
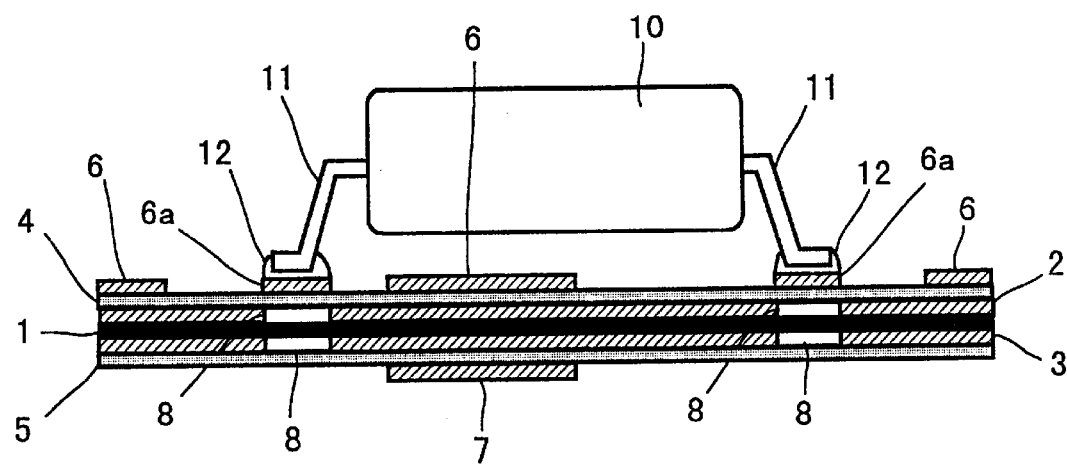
FIG. 6A is a front (partly cross-sectional) view illustrating a semiconductor apparatus (module) using the layered printed-circuit-board, shown in FIG. 5.
Figure 6B:
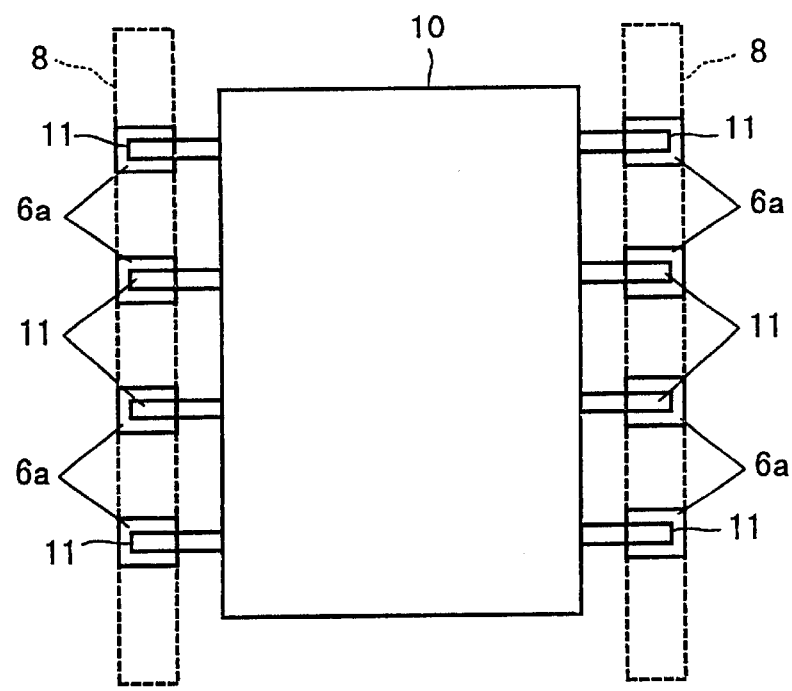
FIG. 6B is a plan view illustrating the semiconductor apparatus, shown in FIG. 6A.

FIG. 6A is a front view (partly cross-sectional) showing a part of a semiconductor apparatus (module) using the printed circuit board, shown in FIG. 5. FIG. 6B is a plan view corresponding to FIG. 6A. The module includes a semiconductor package 10; and leads 11 each connected at one end to a semiconductor chip contained in the package 10. The leads 11 may be made of copper or alloy to transmit electric signals between the semiconductor chip and external devices. The package 10 may be made of epoxy resin or silicon resin to protect the semiconductor chip therein.

The module also includes a layered printed-circuit-board, shown in FIG. 5. On the printed circuit board, the pads 6a and 7a are electrically connected to the leads 11 through conductive material paste (conductive adhesive) 12, such as solder or silver paste.

In the printed circuit board, as shown in FIG. 6A, the intermediate conductive layers 2 and 3 are provided with blank regions (no-pattern regions) 8 right below the pads 6a. The blank regions 8 are empty spaces (filled with, for example, air) which are free of conductive material, and may be formed not only below the pads 6a and 7a but also throughout lead-connecting regions, as shown in FIG. 6B.

For forming the blank regions 8, the intermediate conductive layers 2 and 3, formed on the core layer 1, are removed at the areas corresponding to the pads 6a and 7a by etching or mechanical treatment.

As shown in FIGS. 6A and 6B, the package 10 is mounted on to the layered printed-circuit-board, and the leads 11 are electrically connected through the conductive material (conductive adhesive) 12 to the pads 6a and 7a.

According to the embodiment, the intermediate conductive layers 2 and 3 are provided with blank regions 8 right below (adjacent to) the pads 6a and 7a, so that the volume of the intermediate conductive layers 2 and 3, which have a high thermal expansion coefficient, can be reduced. Further, even when the intermediate conductive layers 2 and 3 are thermally expanded, the blank regions 8 cancel the expansion to some extent. As a result, the thermal expansion coefficient of the layered printed-circuit-board can be close to that of the semiconductor apparatus (package) 10, to be mounted thereon.

In a temperature cycling test, the stress concentrated at the conductive material 12 is eased. Therefore, the quality of semiconductor modules can be improved.

Figure 7:
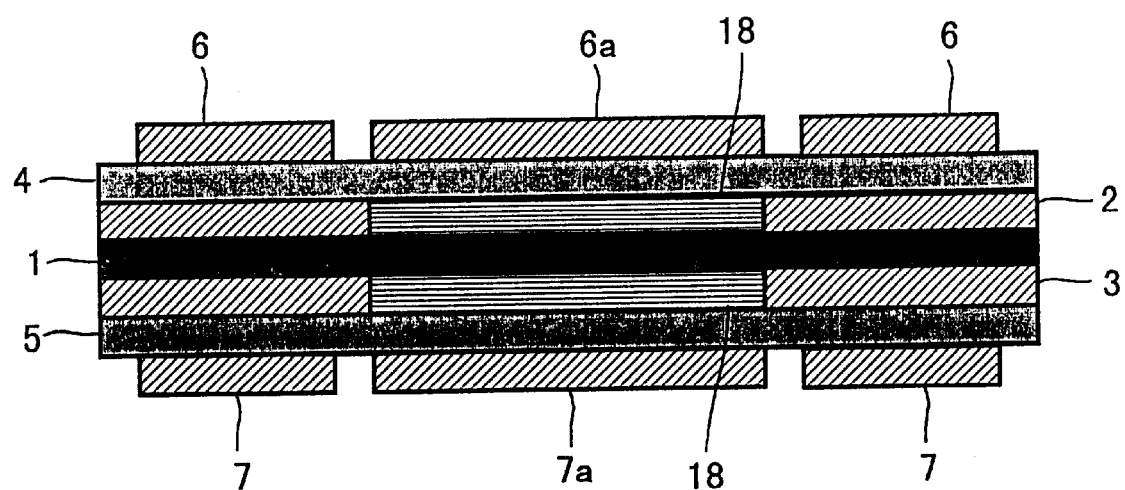
FIG. 7 is a cross-sectional view illustrating a layered printed-circuit-board according to a second preferred embodiment of the present invention.

FIG. 7 is a cross-sectional view showing a layered printed-circuit-board according to a second preferred embodiment of the present invention. The printed circuit board is fabricated to be a four-layered structure, in which four conductive layers are included. The printed circuit board includes a core layer 1; and intermediate conductive layers 2 and 3, which are formed on both surfaces of the core layer 1. The core layer 1 is, for example, made of glass epoxy resin. The intermediate conductive layers 2 and 3 are, for example, made of copper, and are formed throughout on the surfaces of the core layer 1. In this embodiment, the conductive material-free buffer regions contain buffer portions 18 provided on the core layer 1, instead of just being empty (i.e., filled with air) as in the blank regions 8 of the first preferred embodiment. The buffer portions 18 may be made of silicon rubber.

The printed circuit board further includes insulating adhesive layers 4 and 5, respectively formed on the intermediate conductive layers 2 and 3; and surface conductive layers 6 and 7 formed on the insulating adhesive layers 4 and 5, respectively. The insulating adhesive layers 4 and 5 are generally made of epoxy resin. The surface conductive layers 6 and 7 are, for example, made of copper. The printed circuit board further includes pads 6a and 7a on the same level as the surface conductive layers 6 and 7.

The surface conductive layers 6 and 7 mainly function to connect devices mounted on the printed circuit board to each other and to form an electric circuit pattern. In general, the intermediate conductive layers 2 and 3 are connected to the ground or a power supply. The pads 6a and 7a electrically connect electrodes (leads) of a semiconductor chip, to be mounted on the printed circuit board, to the surface conductive layers 6 and 7.

Figure 8A:
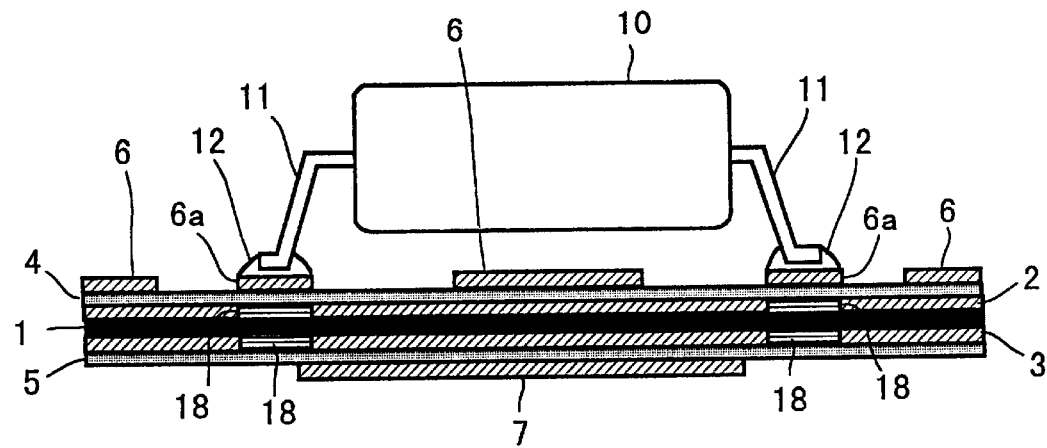
FIG. 8A is a front (partly cross-sectional) view illustrating a semiconductor apparatus (module) using the layered printed-circuit-board, shown in FIG. 7.
Figure 8B:
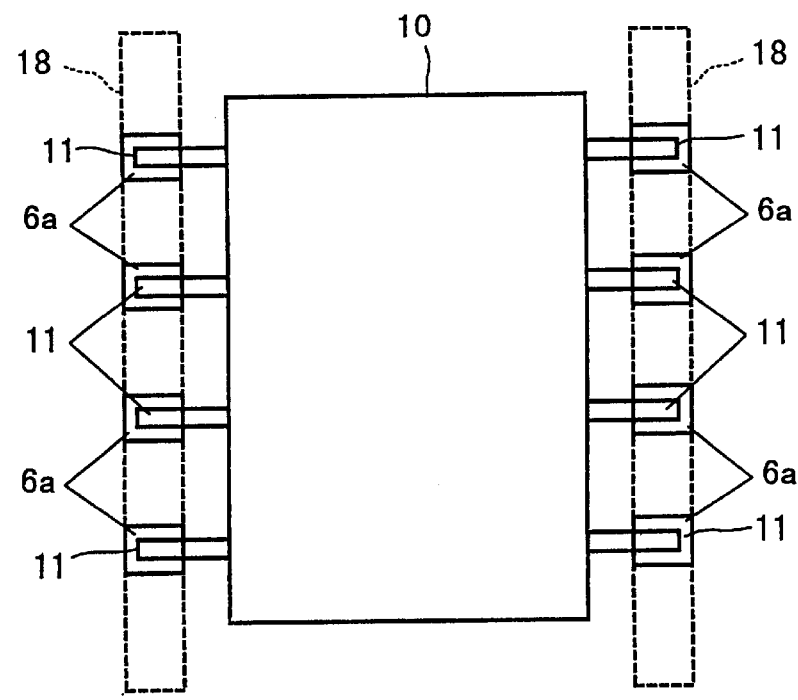
FIG. 8B is a plan view illustrating the semiconductor apparatus, shown in FIG. 8A.

FIG. 8A is a front view (partly cross-sectional) showing a part of a semiconductor apparatus (module) using the printed circuit board, shown in FIG. 7. FIG. 8B is a plan view corresponding to FIG. 8A. The module includes a semiconductor package 10; and leads 11 connected at one ends to a semiconductor chip contained in the package 10. The leads 11 may be made of copper or alloy to transmit electric signals between the semiconductor chip and external devices. The package 10 may be made of epoxy resin or silicon resin to protect the semiconductor chip therein.

The module also includes a layered printed-circuit-board, shown in FIG. 7. On the printed circuit board, the pads 6a and 7a are electrically connected to the leads 11 through conductive material paste (conductive adhesive) 12, such as solder or silver paste.

For forming the buffer portions 18, the intermediate conductive layers 2 and 3, formed on the core layer 1, are removed at the areas corresponding (adjacent) to the pads 6a and 7a by etching or mechanical treatment. Then, the buffer portions 18 are provided in the removed regions. In the layered printed-circuit-board, as shown in FIG. 8A, the buffer portions 18 are arranged right below the pads 6a. The buffer portions 18 may be arranged not only right below the pads 6a and 7a but also throughout lead-connecting regions, as shown in FIG. 8B.

As shown in FIGS. 8A and 8B, the package 10 is mounted on to the layered printed-circuit-board, and the leads 11 are electrically connected through the conductive material (conductive adhesive) 12 to the pads 6a.

According to the embodiment, the intermediate conductive layers 2 and 3 are provided with the buffer portions 18 right below the pads 6a and 7a, so that the volume of the intermediate conductive layers 2 and 3, which have a high thermal expansion coefficient, can be reduced. Further, even when the intermediate conductive layers 2 and 3 are thermally expanded, the buffer portions 18 cancel the expansion to some extent. As a result, the thermal expansion coefficient of the layered printed-circuit-board can be close to that of the semiconductor apparatus (package) 10, to be mounted thereon.

In a temperature cycling test, the stress concentrated at the conductive material 12 is eased. Therefore, the quality of semiconductor modules can be improved.

Figure 9:
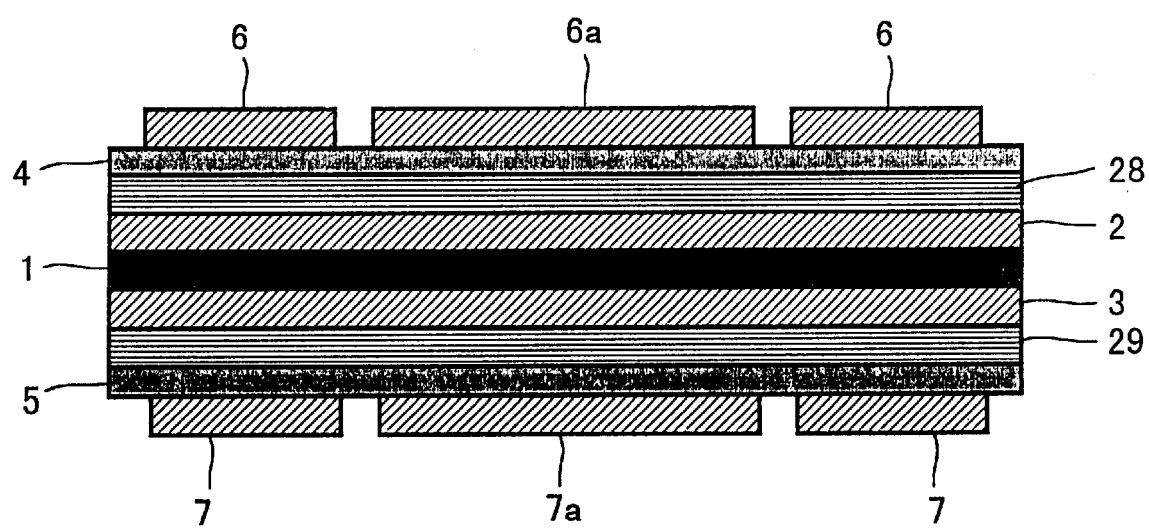
FIG. 9 is a cross-sectional view illustrating a layered printed-circuit-board according to a third preferred embodiment of the present invention.

FIG. 9 is a cross-sectional view showing a layered printed-circuit-board according to a third preferred embodiment of the present invention. The printed circuit board is fabricated to be a four-layered structure, in which four conductive layers are included. The printed circuit board includes a core layer 1; and intermediate conductive layers 2 and 3, which are formed on both surfaces of the core layer 1. The core layer 1 is, for example, made of glass epoxy resin. The intermediate conductive layers 2 and 3 are, for example, made of copper, and are formed throughout on the surfaces of the core layer 1.

The printed circuit board further includes insulating adhesive layers 4 and 5; and surface conductive layers 6 and 7 formed on the insulating adhesive layers 4 and 5. The insulating adhesive layers 4 and 5 are generally made of epoxy resin. The surface conductive layers 6 and 7 are, for example, made of copper. The printed circuit board further includes pads 6a and 7a on the same level as the surface conductive layers 6 and 7.

In this embodiment, buffer layers 28 and 29 are provided between the intermediate (first) conductive layer 2 and the insulating adhesive layer 4 and between the intermediate (first) conductive layer 3 and the insulating adhesive layer 5, respectively. The buffer layers 28 and 29 may be made of silicon rubber.

The surface (second) conductive layers 6 and 7 mainly function to connect devices mounted on the printed circuit board to each other and to form an electric circuit pattern. In general, the intermediate (first) conductive layers 2 and 3 are connected to the ground or a power supply. The pads 6a and 7a electrically connect electrodes (leads) of a semiconductor chip, to be mounted on the printed circuit board, to the surface conductive layers 6 and 7.

In fabrication, the buffer layers 28 and 29 are formed throughout on the intermediate conductive layers 2 and 3, respectively, then the insulating adhesive layers 4 and 5 are formed on the buffer layers 28 and 29, respectively. After that, the surface conductive layers 6 and 7 are formed on the insulating adhesive layers 4 and 5, respectively.

According to the embodiment, stress generated in the intermediate conductive layers 2 and 3, which have a high thermal expansion coefficient, can be buffered by the buffer layers 28 and 29, respectively. As a result, the stress does not reach the surface conductive layers 6 and 7.

In a temperature cycling test, the stress concentrated at the conductive material 12 is eased. Therefore, the quality of semiconductor modules can be improved.

Although each of the above described embodiments is applied to a layered printed-circuit-board on which a T-SOP (Thin Small Outline Package) is mounted, the present invention is applicable to a printed circuit board on which QFP (Quad Flat Package), BGA (Ball Grid Array), CSP (Chip Size Package) or the like is mounted. In addition, the present invention can be applied to a build-up type board, etc.

Further, in each of the above described embodiments, although the present invention is applied to a four-layered printed-circuit-board for easy understanding, the number of conductive layers is not limited for the present invention.

What is claimed is:

1. A printed circuit board comprising:
    a first conductive layer;
    an insulating layer formed on said first conductive layer;
    a second conductive layer formed on said insulating layer and having pads to be connected to leads of a semiconductor package; and
    a buffer region in said first conductive layer, said buffer region having a thermal expansion coefficient lower than a thermal expansion coefficient of said first conductive layer so as to allow for thermal expansion of said first conductive layer.

2. The printed circuit board of claim 1, wherein said first conductive layer is formed of copper.

3. The printed circuit board of claim 1, wherein said buffer region is located adjacent to at least one of said pads.

4. The printed circuit board of claim 1, wherein said buffer region is free of conductive material.

5. The printed circuit board of claim 4, wherein said buffer region contains no solid material.

6. The printed circuit board of claim 4, wherein said buffer region contains a non-conductive buffer portion.

7. The printed circuit board of claim 6, wherein said buffer portion is located adjacent to at least one of said pads.

8. The printed circuit board of claim 6, wherein said buffer portion is formed of silicon rubber.

9. The printed circuit board of claim 1, further comprising a core layer shaped as a flat plate, said first conductive layer being formed on said core layer.

10. A printed circuit board comprising:
    a first conductive layer;
    a buffer layer formed on an entirety of a surface of said first conductive layer, said buffer layer having a thermal expansion coefficient lower than a thermal expansion coefficient of said first conductive layer so as to allow for thermal expansion of said first conductive layer
    an insulating layer formed on said buffer layer; and
    a second conductive layer formed on said insulating layer and having pads to be connected to leads of a semiconductor package.

11. The printed circuit board of claim 10, wherein said first conductive layer is formed of copper.

12. The printed circuit board of claim 10, wherein said buffer layer comprises a non-conductive buffer material.

13. The printed circuit board of claim 12, wherein said buffer material is silicon rubber.

14. The printed circuit board of claim 10, further comprising a core layer shaped as a flat plate, said first conductive layer being formed on said core layer.

15. An apparatus comprising:
    a semiconductor package including a semiconductor chip and leads extending therefrom;
    a printed circuit board, said semiconductor package being mounted on said printed circuit board, said printed circuit board including:
    a first conductive layer;
    an insulating layer formed on said first conductive layer;
    a second conductive layer formed on said insulating layer and having pads electrically connected to said leads of said semiconductor package; and
    a buffer region in said first conductive layer, said buffer region having a thermal expansion coefficient lower than a thermal expansion coefficient of said first conductive layer so as to allow for thermal expansion of said first conductive layer.

16. The apparatus of claim 15, wherein said first conductive layer is formed of copper.

17. The apparatus of claim 15, wherein said buffer region is located adjacent to at least one of said pads.

18. The apparatus of claim 15, wherein said buffer region is free of conductive material.

19. The apparatus of claim 18, wherein said buffer region contains no solid material.

20. The apparatus of claim 18, wherein said buffer region contains a non-conductive buffer portion.

21. The apparatus of claim 20, wherein said buffer portion is located adjacent to at least one of said pads.

22. The apparatus of claim 20, wherein said buffer portion is formed of silicon rubber.

23. The apparatus of claim 15, wherein said printed circuit board further includes a core layer shaped as a flat plate, said first conductive layer being formed on said core layer.

24. An apparatus comprising:
    a semiconductor package including a semiconductor chip and leads extending therefrom;
    a printed circuit board, said semiconductor package being mounted on said printed circuit board, said printed circuit board including:
    a first conductive layer;
    a buffer layer formed on an entirety of a surface of said first conductive layer, said buffer layer having a thermal expansion coefficient lower than a thermal expansion coefficient of said
    first conductive layer so as to allow for thermal expansion of said first conductive layer an insulating layer formed on said buffer layer; and a second conductive layer formed on said insulating layer and having pads electrically connected to said leads of said semiconductor package.

25. The apparatus of claim 24, wherein said first conductive layer is formed of copper.

26. The apparatus of claim 24, wherein said buffer layer comprises a non-conductive buffer material.

27. The apparatus of claim 26, wherein said buffer material is silicon rubber.

28. The apparatus of claim 24, wherein said printed circuit board further includes a core layer shaped as a flat plate, said first conductive layer being formed on said core layer.

* * * * *